United States Patent [19]

Siebert et al.

[11] Patent Number: 4,467,401
[45] Date of Patent: Aug. 21, 1984

[54] ARRANGEMENT FOR THE CONNECTION OF AN ELECTRODE TO A SUPPORT

[75] Inventors: Rainer Siebert, Rothenbach; Erich Bock, Nuremberg, both of Fed. Rep. of Germany

[73] Assignee: Diehl GmbH & Co., Nuremberg, Fed. Rep. of Germany

[21] Appl. No.: 513,000

[22] Filed: Jul. 12, 1983

[30] Foreign Application Priority Data

Jul. 14, 1982 [DE] Fed. Rep. of Germany ....... 3226222

[51] Int. Cl.$^3$ .......................... H05K 7/12; H01G 1/14
[52] U.S. Cl. ...................................... 361/427; 361/306
[58] Field of Search ............... 361/301, 306, 308, 309, 361/331, 427; 357/51; 339/278; 338/197

[56] References Cited

U.S. PATENT DOCUMENTS

| | | | |
|---|---|---|---|
| 2,751,665 | 6/1956 | De Roovere | 361/301 X |
| 2,894,316 | 7/1959 | Genovese | 361/306 X |
| 3,060,356 | 10/1962 | Beyer | 361/308 |
| 4,252,990 | 2/1981 | Sado | 361/308 X |

FOREIGN PATENT DOCUMENTS

| | | |
|---|---|---|
| 2426541 | 3/1975 | Fed. Rep. of Germany . |
| 2445250 | 4/1975 | Fed. Rep. of Germany . |
| 2727823 | 1/1979 | Fed. Rep. of Germany . |

*Primary Examiner*—Donald A. Griffin
*Attorney, Agent, or Firm*—Scully, Scott, Murphy & Presser

[57] ABSTRACT

An arrangement for the mechanical fastening and electrical connection of a pellet, particularly a tantalum pellet, covered with a surface-adherent electrode, to a support. The electrode cannot be subjected to inertial forces of the pellet. An intermediate sheathing is positioned between the electrode and the support. The sheathing non-adhesively encompasses the pellet in a form-fitting manner. The intermediate sheathing is glued to the support. The electrode is electrically connected with the support through a flexible conductor element.

6 Claims, 4 Drawing Figures

ARRANGEMENT FOR THE CONNECTION OF AN ELECTRODE TO A SUPPORT

BACKGROUND OF THE INVENTION

1. Field of the Invention

The present invention relates to an arrangement for the mechanical fastening and electrical connection of a pellet which is covered with a surface-adherent electrode, in particular a tantalum pellet, on or to a support.

2. Discussion of the Prior Art

In electronic circuit installations which are partly integrated and in which there are partly provided miniaturized discrete components (pellets) such as, for example, transistors, diodes and condensers, the surface-adherent electrode is glued onto the support substrate through the intermediary of a conductive adhesive. Such circuit installations are sensitive with respect to encountered mechanical shock. This can be traced back to the fact in that the adherence of the electrode to the pellet is less than the adherence of the electrode to the support. This is particularly the case for tantalum condensers. Shock and vibration loads to which the arrangement is subjected will then lead to a separation of the surface-adherent electrode from the pellet, resulting in destruction of the component. For tantalum condensers there has been observed that, subsequent to the separation of the electrode, a charge of the condenser is no longer useable.

The described phenomenon was also observed for tantalum condensers in which the shaped tantalum pellets which have been coated with the electrode are soldered into an aluminum housing.

SUMMARY OF THE INVENTION

Accordingly, it is an object of the present invention to provide an arrangement of the above-mentioned type wherein the electrode is not subjected to the inertial forces of the pellet.

The foregoing object is inventively achieved by the present invention in that an intermediate sheathing is arranged between the electrode and the support substrate, which form-fittingly and non-adherently encompasses the pellet which has been covered with the electrode, wherein the intermediate sheating is glued to the support substrate, and in which the electrode is electrically connected with the support through a flexible conductor element. Achieved hereby is that the inertial forces of the pellet which are generated during a shock or due to vibrations are absorbed by the support through the intermediate sheating. The electrode does not need to transmit the forces. Through the connection of the electrode by means of the flexible conductor element t,ere is afforded the capability of certain relative movements between the carrier and the pellet without subjecting the electrode to loads.

The foregoing arrangement can also be utilized when the support is the substrate of a hybrid circuit, in effect, also when the support is a metal housing, for example, an aluminum cup or casing for a tantalum condenser.

In an illustrative embodiment of the invention, the intermediate sheathing is formed by a shrinkable hose element.

BRIEF DESCRIPTION OF THE DRAWINGS

Reference may now be had to the following detailed description of advantageous embodiments of the invention, taken in conjunction with the accompanying drawings; in which.

DETAILED DESCRIPTION

Figure 1:
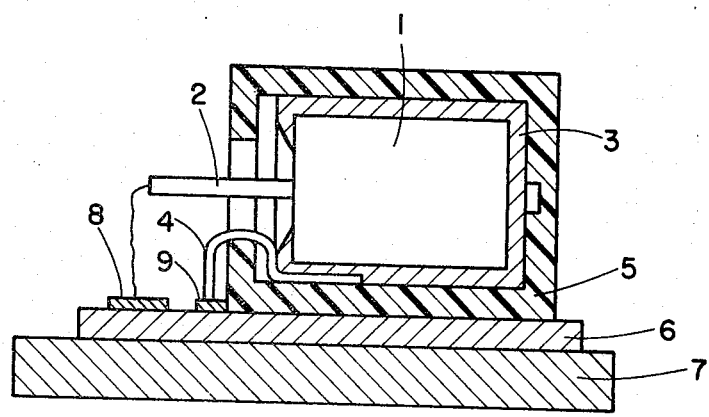
FIGS. 1 through 3 are each, respectively, sectional views through exemplary embodiments of a tantalum condenser which is arranged on a support substrate.

A tantalum pellet 1 includes a terminal pin 2 which constitutes an anode. The tantalum pellet 1 is covered with a layer 3 forming the cathode. This layer adheres to the tantalum pellet 1. Contacting the layer 3 is a flexible conductor element 4. The tantalum pellet 1 which is encompassed by the coating 3 is inserted into an intermediate sheathing 5 constituted of a plastic material. The layer 3 is not glued to the intermediate sheathing 5, but is form-fittingly encompassed thereby.

The intermediate sheathing 5 is glued onto a semiconductor substrate 6, which is seated on a base plate 7. The semi-conductor substrate 6 and the base plate 7 hereby form together the support for the intermediate sheathing 5.

Formed on the substrate 6 are conductive paths 8 and 9. The terminal pin 2 is connected to the conductive path 8 through a flexible connecting wire 10. The conductor element 4 is connected to the conductive path 9.

Figure 2:
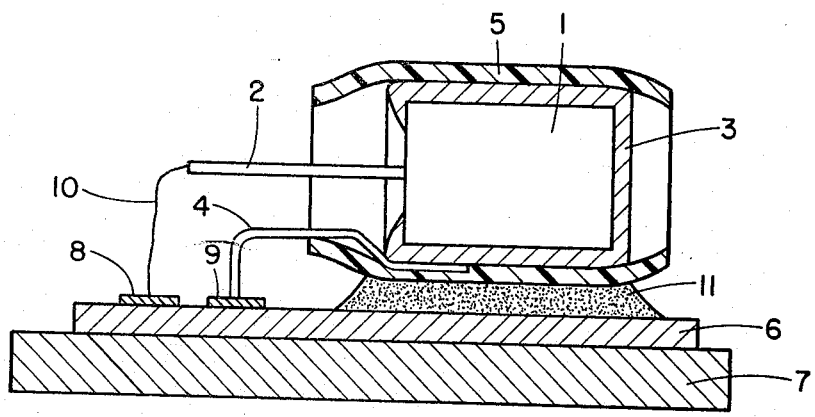

In the embodiment pursuant to FIG. 2 of the drawings the intermediate sheathing 5 is formed by a shrinkable hose element. This hose element is shrunk about the coated tantalum pellet 1 under the effect of heat. Through the utilization of an adhesive layer 11, the shrinkable hose element is glued onto the substrate 6. For the remainder, the embodiment of FIG. 2 corresponds to that of FIG. 1.

Figure 3:
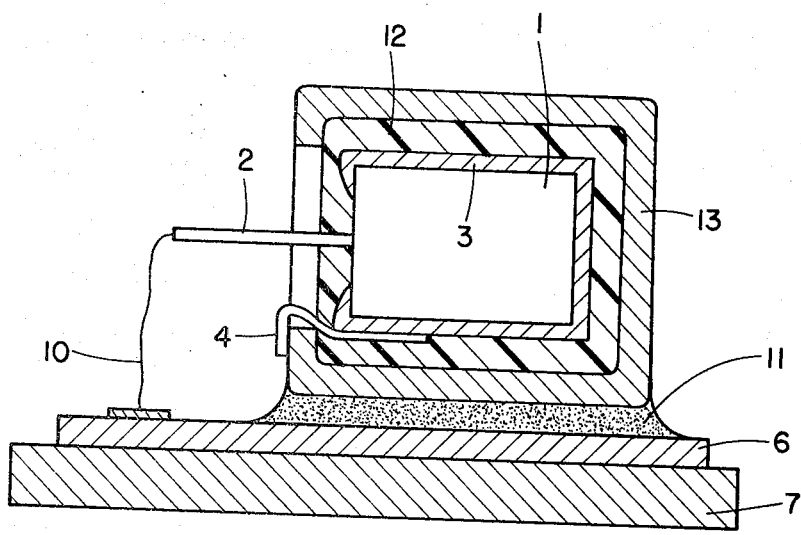

In the embodiment according to FIG. 3 of the drawings, the tantalum pellet which is provided with the layer 3 is embedded in an insulating immersion coating 12 which, for example, is constituted of lacquer or plastic material, and inserted into a cup-shaped metal casing 13. The immersion coating 12 and the metal casing 13 hereby commonly form the intermediate sheathing 5. The flexible conductor element 4 is soldered to the metal casing 13. The metal casing 13 is fastened to the substrate 6 by means of an electrically conductive adhesive 11. The cathode layer 3 is thus connected in an electrically-conductive manner with the substrate 6 itself through the conductor element 4, the metal casing 13 and the adhesive 11.

Figure 4:
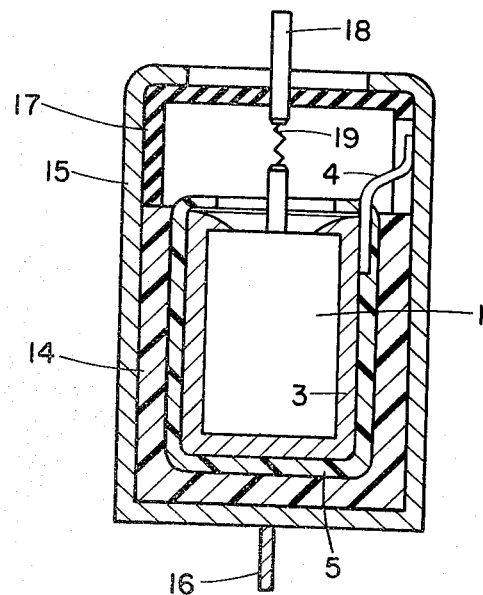
FIG. 4 is a sectional view through a tantalum condenser with an aluminum cup-shaped casing.

In the exemplary embodiment pursuant to FIG. 4 of the drawings, the tantalum pellet 1 which is encompassed by the cathode layer 3 is inserted into a foil, similarly not adhesively, which forms the intermediate sheathing 5. In lieu of the foil there can also be utilized a shrinkable shaped component.

The foil is embedded in a casting compound 14, for example, solder or a casting resin. The outer jacket of the condenser is formed by a cup-shaped aluminum casing 15. The casting compound 14 together with the aluminum casing 15 form the support for the foil. The flexible conductor element 4 is conducted interiorly to the casing 15. The latter includes a connector extension 16 at its lower end.

In the casing 15 a non-conductive cover 17 is seated on the casting compound, on which there is arranged a further connector extension 18. The latter is connected within the casing 15 with the terminal pin 2 through a flexible conductor element 19.

When a shock acts on the support, which in the exemplary embodiments pursuant to FIGS. 1 to 3 is formed by the base plate 7 with the substrate 6, and in FIG. 4 by the casing 15, the shock then propagates further onto the tantalum pellet 1. The intermediate sheating 5 grips the pellet 1 which is provided with the layer 3, in that it form-fittingly encompasses the pellet. Hereby, in that the cathode layer 3 is not glued together with the intermediate sheathing 5, it is not subjected to accelerating and distorting forces which are encountered in response to shock. Through the flexible construction of the electrical connections there is ensured that these will not transmit any forces from the support to the layer 3, or respectively, the pellet 1.

Particularly in the embodiment according to FIG. 2 of the drawings, a certain elasticity of the intermediate sheathing 5 can lead to the aspect, that, during vibrations of the support, the pellet will vibrate in conjunction therewith only in an attenuated manner.

What is claimed is:

1. In an arrangement for the mechanical fastening and electrical connection of a pellet which is covered with a surface-adherent electrode, in particular a tantalum pellet, with a support; the improvement comprising, an intermediate sheathing being positioned between the electrode and the support, said sheathing encompassing the pellet which is covered with the electrode in a non-adherent, form-fitted manner, said intermediate sheathing being glued to said support; and a flexible conductor element electrically connecting said electrode with said support.

2. Arrangement as claimed in claim 1, wherein said intermediate sheathing comprises a plastic material foil.

3. Arrangement as claimed in claim 1, wherein said intermediate sheathing comprises a shrinkable hose element.

4. Arrangement as claimed in claim 1, wherein said intermediate sheathing comprises an immersion coating and a cup-shaped metal casing; an electrically-conductive adhesive fastening said sheating to said support, said conductor element being connected with said metal casing.

5. Arrangement as claimed in claim 1, wherein said support comprises a substrate layer and a base plate.

6. Arrangement as claimed in claim 1, wherein said support comprises a cup-shaped aluminum casing, said intermediate sheathing in said casing being embedded in a casting compound.

* * * * *